(12) United States Patent
Srinivasan et al.

(10) Patent No.: US 9,443,728 B2
(45) Date of Patent: Sep. 13, 2016

(54) ACCELERATED RELAXATION OF STRAIN-RELAXED EPITAXIAL BUFFERS BY USE OF INTEGRATED OR STAND-ALONE THERMAL PROCESSING

(71) Applicant: Applied Materials, Inc., Santa Clara, CA (US)

(72) Inventors: Swaminathan T. Srinivasan, Pleasanton, CA (US); Atif M. Noori, Saratoga, CA (US); David K. Carlson, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/461,191

(22) Filed: Aug. 15, 2014

(65) Prior Publication Data

US 2015/0050753 A1  Feb. 19, 2015

Related U.S. Application Data (60) Provisional application No. 61/866,881, filed on Aug. 16, 2013.

(51) Int. Cl.
*H01L 21/02* (2006.01)
*H01L 21/67* (2006.01)
*H01L 21/324* (2006.01)

(52) U.S. Cl.
CPC ... *H01L 21/02664* (2013.01); *H01L 21/02532* (2013.01); *H01L 21/02538* (2013.01); *H01L 21/67011* (2013.01); *H01L 21/6719* (2013.01); *H01L 21/67098* (2013.01); *H01L 21/67115* (2013.01); *H01L 21/67207* (2013.01); *H01L 21/67248* (2013.01); *H01L 21/0237* (2013.01); *H01L 21/02439* (2013.01); *H01L 21/324* (2013.01); *H01L 21/3245* (2013.01)

(58) Field of Classification Search
CPC ............. H01L 21/02661; H01L 21/02664; H01L 21/02532; H01L 21/02538; H01L 21/67011; H01L 21/67098; H01L 21/67155
See application file for complete search history.

(56) References Cited

U.S. PATENT DOCUMENTS

| | | | |
|---|---|---|---|
| 6,376,804 B1 | 4/2002 | Ranish et al. | |
| 6,906,400 B2 | 6/2005 | Delhougne et al. | |
| 7,030,002 B2 * | 4/2006 | Tweet | H01L 21/02381 257/E21.12 |
| 7,115,521 B2 * | 10/2006 | Brabant | C30B 25/02 438/486 |
| 7,202,145 B2 * | 4/2007 | Cao | H01L 21/02381 257/E21.102 |

(Continued)

OTHER PUBLICATIONS

Sandhu et al., Materials and Device Properties of Ultra-Thin 6.0 Å INXAL1-XAS Graded Buffer Layers and HBTS, 2005 International Conference on Indium Phosphide and Related Materials, pp. 86-89.

(Continued)

*Primary Examiner* — Joseph C Nicely
(74) *Attorney, Agent, or Firm* — Patterson & Sheridan, LLP (57) ABSTRACT

Implementations of the present disclosure generally relate to methods and apparatus for forming a film on a substrate. More particularly, implementations of the present disclosure relate to methods and apparatus for heteroepitaxial growth of crystalline films. In one implementation, a method of heteroepitaxial deposition of a strain relaxed buffer (SRB) layer on a substrate is provided. The method comprises epitaxially depositing a buffer layer over a dissimilar substrate, rapidly heating the buffer layer to relax the buffer layer, rapidly cooling the buffer layer and determining whether the buffer layer has achieved a desired thickness.

20 Claims, 6 Drawing Sheets

(56) References Cited

U.S. PATENT DOCUMENTS

| | | |
|---|---|---|
| 7,262,116 B2 | 8/2007 | Singh et al. |
| 7,364,991 B2 | 4/2008 | Bour et al. |
| 7,396,743 B2 | 7/2008 | Singh et al. |
| 7,560,364 B2 | 7/2009 | Bour et al. |
| 7,648,853 B2 * | 1/2010 | Bauer ............... H01L 21/02381 257/E21.102 |
| 8,008,166 B2 | 8/2011 | Sanchez et al. |
| 8,404,048 B2 | 3/2013 | Ewert et al. |
| 2001/0026669 A1 * | 10/2001 | Nashimoto ........... G02B 6/1228 385/129 |
| 2002/0182839 A1 * | 12/2002 | Ogawa ............... H01L 21/0242 438/604 |
| 2003/0080344 A1 * | 5/2003 | Yoo ................... H01L 33/0079 257/103 |
| 2003/0159650 A1 * | 8/2003 | Yang .................. H01L 21/3225 117/89 |
| 2003/0178633 A1 * | 9/2003 | Flynn ................. H01L 29/155 257/101 |
| 2004/0003873 A1 * | 1/2004 | Chen .................... C22F 1/02 148/518 |
| 2004/0045598 A1 * | 3/2004 | Narayanan ........ H01L 31/03046 136/255 |
| 2004/0227158 A1 * | 11/2004 | Delhougne ....... H01L 21/02381 257/202 |
| 2005/0092235 A1 * | 5/2005 | Brabant ................ C30B 25/02 117/105 |
| 2005/0181592 A1 * | 8/2005 | Tweet ............... H01L 21/02381 438/602 |
| 2005/0271827 A1 * | 12/2005 | Krunks .................. C23C 18/02 427/446 |
| 2006/0022200 A1 * | 2/2006 | Shiono .............. H01L 21/02381 257/65 |
| 2006/0257626 A1 * | 11/2006 | Schlesser ............... C30B 25/02 428/141 |
| 2007/0224786 A1 * | 9/2007 | Brabant ................ C30B 25/02 438/478 |
| 2007/0231488 A1 * | 10/2007 | Von Kaenel ........ C23C 16/0209 427/255.15 |
| 2008/0003397 A1 * | 1/2008 | Rasanen ................ G11C 13/04 428/64.4 |
| 2008/0203083 A1 * | 8/2008 | Wirth ............... H01L 21/67109 219/411 |
| 2008/0206987 A1 * | 8/2008 | Gelatos ................. C23C 16/14 438/654 |
| 2009/0142870 A1 * | 6/2009 | Miki .................. C23C 14/0036 438/46 |
| 2009/0212398 A1 * | 8/2009 | Suzuki ................... H01L 33/12 257/618 |
| 2009/0289333 A1 * | 11/2009 | Lujan .................. H01L 27/1218 257/640 |
| 2009/0308636 A1 * | 12/2009 | Chudzik .......... H01L 21/28088 174/126.4 |
| 2010/0267249 A1 | 10/2010 | Kim et al. |
| 2011/0027974 A1 * | 2/2011 | Su ....................... C23C 16/4488 438/478 |
| 2011/0129949 A1 * | 6/2011 | Svensson .......... H01L 21/02387 438/16 |
| 2012/0080753 A1 * | 4/2012 | Singh .................... B82Y 30/00 257/347 |
| 2012/0145684 A1 | 6/2012 | Carey et al. |
| 2012/0241753 A1 * | 9/2012 | Akiyama ............ H01L 21/0242 257/76 |
| 2012/0319120 A1 * | 12/2012 | He .................... H01L 29/66545 257/66 |
| 2013/0056793 A1 | 3/2013 | Srinivasan |
| 2013/0062753 A1 * | 3/2013 | Nguyen ............. H01L 29/1054 257/734 |
| 2013/0186464 A1 * | 7/2013 | Sheng .................. H01L 31/068 136/256 |
| 2013/0206362 A1 * | 8/2013 | Li ..................... H01L 21/67115 165/61 |
| 2013/0213469 A1 * | 8/2013 | Kramer ............. H01L 31/02245 136/256 |
| 2013/0256760 A1 * | 10/2013 | Bao .................. H01L 21/02381 257/200 |
| 2015/0079803 A1 * | 3/2015 | Huang ............. H01L 21/02373 438/758 |
| 2015/0140792 A1 * | 5/2015 | Castaldi ............. H01L 21/0242 438/479 |

OTHER PUBLICATIONS

Cavus et al., Development of 6.00 Å Graded Metamorphic Buffer Layers and High Performance In0.86A10.14As/In0.86Ga0.14As Heterojunction Bipolar Transistor Devices, J. Vac. Sci. Technol. B 24(3), May/Jun. 2006, American Vacuum Society 2006, pp. 1492-1495.

Noon et al., Strain Relaxation and Surface Roughness of InxAl1-xAs Graded Buffer Layers Grown on InP for 6.05 Å Applications, J. Vac. Sci. Technol. B 22(5), Sep./Oct. 2004, American Vacuum Society 2004, pp. 2303-2308.

Cavus et al., Metamorphic 6.0 Å Narrow Band Gap HBT Technology on INP Substrates, 2006, IEEE, pp. 381-386.

* cited by examiner

ACCELERATED RELAXATION OF STRAIN-RELAXED EPITAXIAL BUFFERS BY USE OF INTEGRATED OR STAND-ALONE THERMAL PROCESSING

CROSS-REFERENCE TO RELATED APPLICATIONS

This application claims benefit of U.S. provisional patent application Ser. No. 61/866,881, filed Aug. 16, 2013. The aforementioned related patent application is herein incorporated by reference in its entirety.

BACKGROUND

1. Field

Implementations of the present disclosure generally relate to methods and apparatus for forming a film on a substrate. More particularly, implementations of the present disclosure relate to methods and apparatus for heteroepitaxial growth of crystalline films.

2. Description of the Related Art

Group III-V and Group IHV compounds are finding greater importance in the development and fabrication of a variety of semiconductor devices, such as, for example, light emitting diodes (LEDs), laser diodes (LDs) and logic circuit devices such as field effect transistors (FETs. In these devices, a plurality of semiconductor layers having different mixed crystal compositions are layered together to obtain intended optical and electrical characteristics.

Group III-V and Group II-IV compound films are generally formed by heteroepitaxy, a form of epitaxy. In epitaxy, a monocrystalline film is deposited on a monocrystalline substrate from gaseous or liquid precursors. During deposition, the substrate acts as a seed crystal, the deposited film takes on a lattice structure and orientation identical to those of the substrate. The deposited film is typically referred to as an epitaxial film or epitaxial layer. In heteroepitaxy, the epitaxial film and the substrate include different materials. Typically, substrates having similar properties as the target epitaxy film are used in heteroepitaxy to prevent deformation or cracking of the substrate and the epitaxy film during and after epitaxy. For example, gallium nitride (GaN) is formed by heteroepitaxy on sapphire, and aluminum gallium indium phosphide (AlGaInP) on gallium arsenide (GaAs).

In an attempt to reduce cost in forming group metal nitride based devices, metal nitride films are manufactured on larger and cheaper substrates. However, metal nitrides and silicon substrates have different properties, such as lattice constant and thermal expansion coefficient. The differences in properties introduce defects in the metal nitride film and even cause silicon substrates and nitride films to crack when growing high crystalline nitrides. For example, when growing gallium nitride material on a silicon substrate, mechanical stress and thermal stress are generated due to difference in lattice constants and thermal expansion coefficients causing the silicon substrate to bow and the gallium nitride film and even the silicon substrate to crack.

Epitaxial wafer materials are widely used as starting materials in semiconductor device fabrication. The presence of defects in such wafer materials can seriously affect the subsequent device performance. For example, GaN and its related compounds InGaN and AlGaN are widely used in the fabrication of short-wavelength semiconductor laser diodes. The performance of such laser diodes is seriously degraded by the presence of threading dislocations, which thread vertically through the epitaxial layers. Similar defects are found in other material systems, for example, when GaAs is grown on SiGe/Si. A reduced dislocation density on the epitaxial wafer materials is therefore desired.

One approach to reducing the defect density involves growing thick strain relaxed buffer (SRB) layers on the substrate to absorb that may be targeted for strain relaxation. Others have attempted to grow dissimilar materials that have a tendency to relax quickly on the substrate of choice, or otherwise grow thicker films that eventually relax due to accumulated strain. However, these processes often take a long time to complete and involve costly materials.

Therefore there is a need for methods for forming strain thinner relaxed buffer layers that reduce defect density while reducing processing times and costs.

SUMMARY

Implementations of the present disclosure generally relate to methods and apparatus for forming a film on a substrate. More particularly, implementations of the present disclosure relate to methods and apparatus for heteroepitaxial growth of crystalline films. In one implementation, a method of heteroepitaxial deposition of a strain relaxed buffer (SRB) layer on a substrate is provided. The method comprises epitaxially depositing a buffer layer over a dissimilar substrate, rapidly heating the buffer layer to relax the buffer layer, rapidly cooling the buffer layer and determining whether the buffer layer has achieved a desired thickness.

In another implementation, a method of forming a heteroepitaxial film on a substrate in an integrated processing system is provided. The method comprises epitaxially depositing a buffer layer over a dissimilar substrate in a first processing chamber of an integrated processing system, removing the substrate from the first processing chamber without exposing the substrate to atmosphere, transferring the substrate to a second processing chamber of the integrated processing system and annealing the buffer layer in the second processing chamber.

In yet another implementation, a method of forming a heteroepitaxial film on a substrate in an integrated processing system is provided. The method comprises epitaxially depositing a buffer layer over a dissimilar substrate in a first processing chamber of an integrated processing system, removing the substrate from the integrated processing system, transferring the substrate to a second processing chamber positioned ex-situ to the integrated processing system and annealing the buffer layer in the second processing chamber.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Implementations of the present disclosure generally relate to methods and apparatus for forming a film on a substrate. More particularly, implementations of the present disclosure relate to methods and apparatus for heteroepitaxial growth of crystalline films.

Strain relaxation typically occurs through the generation of misfit dislocations. Misfit dislocation glide is a thermally activated process and is dictated by the dislocation glide velocity. Use of high temperatures with or without fast temperature ramp-ups will help increase the dislocation velocity, thereby reducing the minimum number of dislocations required to relax the strain in the buffer, and thereby reducing the defect density that propagates to the active area. Additionally, fast cool-downs can help quench further defect motion and provide additional defect engineering process capability. To ensure full relaxation in a controlled, repeatable manner, the use of thermal processes such as rapid thermal processing (RTP) soak anneals, spike anneals, millisecond anneals and nanosecond anneals (in sub-melt or melt time-temperature regimes) are contemplated. Since the SRB after relaxation is a potential template for high quality epitaxial growth rapid thermal processing may be performed in an integrated cluster tool where both epitaxial and RTP chambers exist. In addition other chambers, for example, a pre-clean chamber may be positioned on the integrated platform. Pre-clean chambers may be used if the RTP SRB relaxation is performed in an ex-situ thermal chamber. If a constantly graded or step graded buffer layer is deposited, thermal anneal processes may be performed intermittently during growth in the integrated tool to ensure full relaxation of the underlying buffer segment.

Benefits of the implementations described herein include increased speed of the process, thus making SRB Epitaxy more palatable to customers who are striving to manage cost/wafer. Additionally, a thinner buffer layer may be possible with the implementations described herein. Secondary benefits include increasing the degree of relaxation, thus leading to higher quality epitaxial material above the SRB. The thinner than usual SRB is fully relaxed due to a combination of epitaxy (or at least deposition) and thermal processing.

The implementations described herein enable adoption of SRBs for a wide variety of epitaxial and other processes for a wide variety of materials including but not limited to Group III-V materials and Group IV semiconductor materials.

While the particular apparatus in which the implementations described herein can be practiced is not limited, it is particularly beneficial to practice the implementations in thermal processing systems such as the RADIANCE® RTP system, RADIANCEPLUS™ RIP system, ASTRA® DSA (dynamic surface anneal), VULCAN™ RTP system; in deposition systems such as the RP EPI system; on platforms such as the CENTURA® platform, ENDURA® platform, and the VANTAGE® platform all available from Applied Materials, Inc., Santa Clara, Calif. Additionally, thermal processing systems and deposition systems available from other manufacturers may also benefit from implementations described herein. The processing chambers depicted in FIG. 1A and FIG. 1B are illustrative only and the present inventive methods may be used to advantage in other processing chambers as well, including those configured for processes other than epitaxial deposition processes.

Figure 1A:
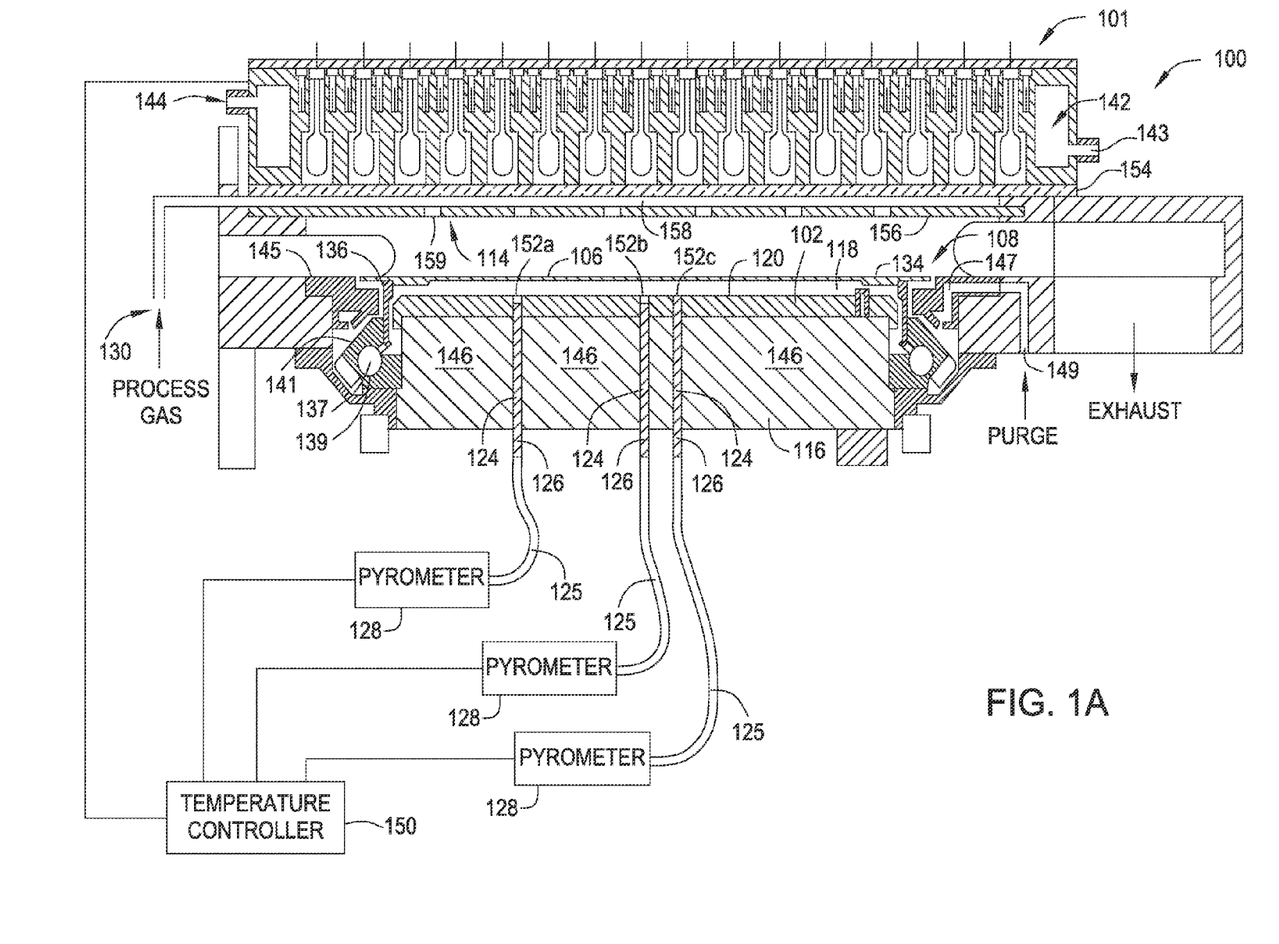
FIG. 1A is a schematic cross-sectional view of a rapid thermal processing (RIP) system for performing certain implementations described herein.
Figure 1B:
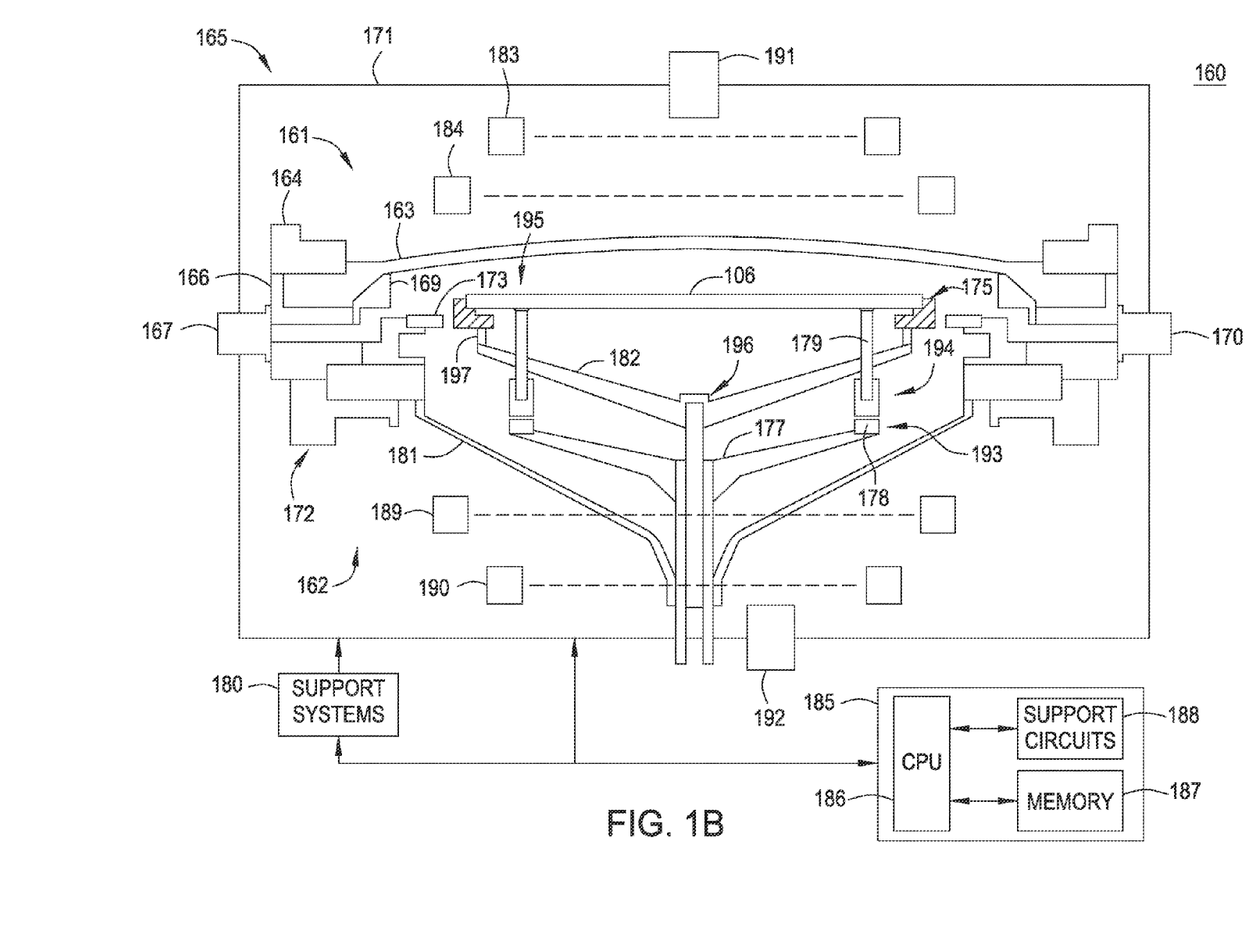
FIG. 1B is a schematic cross-sectional view of a susceptorless epitaxial deposition chamber for performing certain implementations described herein.

FIG. 1A depicts a Rapid Thermal Processing system (RTP) in accordance with some implementations of the present disclosure. Exemplary RTP chambers may include the RADIANCE® or RADIANCEPlus chambers available from Applied Materials, Inc of Santa Clara, Calif. The RTP system may include a processing chamber 100 having a lamphead 101 for processing a substrate 106. The lamphead 101 may include an array of lamps as depicted in FIG. 1.

The substrate 106 is mounted inside the chamber 100 on a substrate support 108 and is heated by the lamphead 101, which is disposed in a position opposing the substrate support 108. The lamphead 101 generates radiation which is directed to a front side 107 of the substrate 106. Alternatively (not shown), the lamphead 101 may be configured to heat the back side of the substrate 106, for example, such as by being disposed below the substrate 106, or by directing the radiation to the back side of the substrate 106. The radiation enters the processing chamber 100 through the window assembly 114. The window assembly 114 may be a water-cooled quartz window assembly 114. Beneath the substrate 106 is a reflector 102, which is mounted on a water-cooled, base 116. The base 116 may be a stainless steel base. The base 116 includes a circulation circuit 146 through which coolant circulate to cool the reflector 102. In some implementations, the reflector 102 is made of aluminum and has a highly reflective surface coating 120. Water, which may be above 23 degrees Celsius, may be circulated through the base 116 to keep the temperature of the reflector 102 well below that of the heated substrate 106. Alternatively, other coolants may be provided at the same or different temperatures. For example, antifreeze (e.g., ethylene glycol, propylene glycol, or the like) or other heat transfer fluids may be circulated through the base 116 and/or the base 116 may be coupled to a chiller (not shown). An underside or backside of the substrate 106 and the top of the reflector 102 form a reflecting cavity 118. The reflecting cavity 118 enhances the effective emissivity of the substrate 106.

The temperatures at localized regions of the substrate 106 are measured by a plurality of temperature sensors, such as 152a, 152b, and 152c. Each temperature sensor includes a light pipe 126 that passes through a conduit 124 that extends from the backside of the base 116 through the top of the reflector 102. The light pipe 126 may be a sapphire light pipe 126. In some implementations, the light pipe 126 is about 0.125 inch in diameter and the conduit 124 is slightly larger. The light pipe 126 is positioned within the conduit 124 so that its uppermost end is flush with or slightly below the upper surface of the reflector 102. The other end of light pipe 126 couples to a flexible optical fiber 125 that transmits sampled light from the reflecting cavity 118 to a pyrometer 128.

The pyrometer 128 is connected to a controller 150 which controls the power supplied to the lamphead 101 in response to a measured temperature. In some implementations, such as for a 200 mm wafer, the lamphead 101 may use 187 lights to deliver highly collimated radiation from tungsten-halogen lamps to the processing chamber 100. In some implementations, such as for a 300 mm wafer, the lamphead 101 may use 409 lights. The number and configuration of the lights disclosed herein are exemplary and other numbers and configurations may also suitably be used.

The lamps may be divided into multiple zones. The zones can be individually adjusted by the controller to allow controlled radiative heating of different areas of the substrate 106. Such a control system is described in U.S. Pat. No. 5,755,511.

As indicated above, the described implementations use measurement or temperature sensors distributed over the reflector 102 so as to measure the temperature at different radii of the substrate 106. During the thermal processing, the substrate 106 is rotated, for example, at about 240 rpm. Thus, each sensor actually samples the temperature profile of a corresponding annular ring area on the substrate 106.

The substrate support 108 may be configured to be stationary or may rotate the substrate 106. The substrate support 108 includes a support or an edge ring 134 which contacts the substrate 106 around the substrate's outer perimeter, thereby leaving the entire underside of the substrate 106 exposed except for a small annular region about the outer perimeter. The support ring 134 is also known as the edge ring 134 and these two terms can be interchangeably used within the specification. In some implementation, the support ring 134 has a radial width of approximately one inch (2.5 centimeters (cm)). To minimize the thermal discontinuities that will occur at the edge of the substrate 106 during processing, the support ring 134 is made of the same, or similar, material as that of the substrate 106, for example, silicon or silicon carbide.

The support ring 134 rests on a rotatable tubular quartz cylinder 136 that is coated with silicon to render it opaque in the frequency range of the pyrometer 128. The silicon coating on the quartz cylinder 136 acts as a baffle to block out radiation from the external sources that might contaminate the intensity measurements. The bottom of the quartz cylinder 136 is held by an annular upper bearing 141 which rests on a plurality of ball bearings 137 that are, in turn, held within a stationary, annular, lower bearing race 139. In some implementations, the ball bearings 137 are made of steel and coated with silicon nitride to reduce particulate formation during operations. The annular upper bearing 141 is magnetically coupled to an actuator (not shown) which rotates the quartz cylinder 136, the edge ring 134 and the substrate 106 during the thermal processing.

A purge ring 145, which is fitted into the chamber body, surrounds the quartz cylinder 136. In some implementations, the purge ring 145 has an internal annular cavity 147 which opens up to a region above the annular upper bearing 141. The internal annular cavity 147 is connected to a gas supply (not shown) through a passageway 149. During processing, a purge gas is flowed into the chamber through the purge ring 145. Gases are exhausted through an exhaust port, which is coupled to a vacuum pump (not shown).

In some implementations, the support ring 134 has an outer radius that is larger than the radius of the quartz cylinder 136 so that it extends out beyond the quartz cylinder 136. The annular extension of the support ring 134 beyond the cylinder 136, in cooperation with the purge ring 145 located below it, functions as a baffle which prevents stray light from entering the reflecting cavity 118 at the backside of the substrate 106. To further reduce the possibility of stray light entering into the reflecting cavity 118, the support ring 134 and the purge ring 145 may also be coated with a material (for example, a black or gray material) that absorbs the radiation generated by the lamphead 101.

The window assembly 114 is disposed in an upper portion of the processing chamber 100 to allow light energy provided by the lamphead 101 to enter the processing chamber 100. In some implementations, the window assembly 114 includes an upper window 154 and a lower window 156. The upper window 154 and the lower window 156 each comprise a material transparent to the energy provided by the lamphead 101 to allow radiation from the lamphead 101 to enter the processing chamber 100 therethrough. In some implementations, the upper window 154 and the lower window 156 are quartz. However, the upper window 154 and the lower window 156 may be made out of different materials as well.

Generally, the upper window 154 and the lower window 156 are configured to allow the maximum energy provided by the lamphead 101 to pass therethrough. In some implementations, a thickness of the upper window 154 and/or the lower window 156 may be varied to control the quantity of energy passing therethrough. For example, in some implementations the thickness of the upper window may be between about 3 to about 8 mm. In some implementations, the thickness of the lower window may be between about 3 to about 8 mm.

During processing, a processing gas can be introduced into the processing chamber 100 above the substrate 106 through the window assembly 114. The window assembly 114 may be used to more uniformly distribute the processing gas to the substrate 106 from overhead, as compared to processing chambers utilizing side injecting gas systems (e.g., delivering gas into the processing volume of the processing chamber from the sides of the processing chamber).

In some implementations, the lower window 156 is disposed below the upper window 154 and is spaced apart therefrom, to define a gap 158 therebetween. The gap 158 forms a plenum for receiving and flowing the processing gas therein from the inlet 130. In some implementations, the gap may be between about 1-5 mm. The lower window 156 includes one or more outlets 159 for delivering a processing gas from the plenum (e.g., the gap 158) into the processing volume of the processing chamber 100. The size, geometry, number, and location of the one or more outlets 159 can be selectively chosen to facilitate a desired pattern of processing gas flow.

For example, a cross section of each outlet 159 may be round, rectangular, square, oval, slotted, polygonal, or the like or combinations thereof. Each outlet 159 may have a cross-section configured, for example, control the flow rate and/or direction of a processing gas flowing therefrom. In some implementations, at least some outlets 159 may have a cross section that varies along an axis parallel to the direction of gas flow. For example, in some implementations, at least some outlets 159 may have an expanding cross section to facilitate dispersing the processing gas flowing therethrough. For example, at least some outlets 159 may have a first width proximate an upper surface of the lower window 156 that is less than a second width proximate a lower, substrate support-facing surface of the lower window 156. In some implementations, at least some outlets 159 may have a tapering cross section to facilitate providing a higher velocity of the processing gas flowing therethrough. For example, at least some outlets 159 may have a first width proximate the upper surface of the lower window 156 that is greater than a second width proximate the lower, substrate support-facing surface of the lower window 156. In some implementations, at least some outlets 159 may have a non-vertical central axis to facilitate directing the flow of the processing gas flowing therethrough at a non-perpendicular angle to the substrate.

The one or more outlets 159 may be distributed in the lower window 156 in any suitable configuration to achieve a desired distribution of a processing gas to the substrate 106. The desired distribution may be uniform or non-uniform, depending upon the process being performed in the processing chamber. For example, a plurality of outlets 159 may be distributed as desired in two dimensions across the surface of the lower window 156. In some implementations, the plurality of outlets 159 may be uniformly distributed across the entire surface of the lower window 156. In some implementations, the plurality of outlets 159 may be grouped into one or more desired zones, such as an outer zone, an intermediate zone, and an inner zone. In such a configuration of the one or more outlets 159, the substrate support 108 may be stationary or rotating about a central axis.

The lampheads are typically adapted to heat the buffer layer formed on the substrate 106 to a temperature sufficient to cause the buffer layer to relax. The temperature sufficient to cause the buffer layer to relax may be dependent upon factors including but not limited to the buffer materials and substrate materials used, the relative strain with respect to the substrate material and the duration of the process. The lamphead 101 may be adapted to heat the buffer layer formed on the substrate 106 to a temperature within a range of about 10 degrees Celsius to about 1800 degrees Celsius, such as about 400 degrees Celsius to about 600 degrees Celsius. The lamphead 101 may be coupled to a power distribution board (not shown) through which power is supplied to each lamp of the lamphead 101. The lamphead 101 may be cooled during or after processing by, for example, a cooling fluid.

A cooling chamber 142 is defined by upper and lower chamber walls and a cylindrical wall. A coolant such as water may be introduced into the chamber via inlet 143 and removed via outlet 144.

The controller 150 receives data from the temperature sensors 152a-c and separately adjusts power delivered to each lamp of the lamphead 101, or individual groups of lamps or lamp zones, based on the data. The controller 150 may include a power supply that independently powers the various lamps or lamp zones. The controller 150 can be configured with a desired temperature profile, and based on comparing the data received from the temperature sensors 152a-c, the controller 150 adjusts power to lamps and/or lamp zones to conform the observed thermal data to the desired temperature profile. The controller 150 may also adjust power to the lamps and/or lamp zones to conform the thermal treatment of one substrate to the thermal treatment of another substrate, in the event chamber performance drifts over time.

FIG. 1B is a schematic cross-sectional view of a susceptorless epitaxial deposition chamber for performing certain implementations described herein. An exemplary processing chamber is described below with respect to FIG. 1B, which depicts a schematic, cross-sectional view of a substrate processing chamber 160 suitable for use with implementations of the present disclosure. The processing chamber 160 may be adapted for performing epitaxial deposition processes as discussed above and illustratively comprises a chamber body 165 having an annulus or substrate support ring 175 such that the backside of the substrate 106 is exposed during processing. In some implementations, the multi-zonal energy source may be a multi-zonal radiant energy source, such as provided by one or more of lamps 183, 184, 189, 190 shown in the substrate processing chamber 160 of FIG. 1B. The one or more lamps 183, 184, 189, 190 emit radiant energy to heat the processing gases to a desired temperature to facilitate thermal decomposition of the processing gases. The lamps 183, 184, 189, 190 may be adapted to heat the processing gases to a temperature of about 300 degrees Celsius to about 1200 degrees Celsius, such as about 300 degrees Celsius to about 950 degrees Celsius.

The chamber body 165 generally includes an upper portion 161, a lower portion 162, and an enclosure 171. The upper portion 161 is disposed on the lower portion 162 and includes a lid 163, a clamp ring 164, a liner 169, a baseplate 166, one or more upper lamps 183 and one or more lower lamps 184, and an upper pyrometer 191. In one implementation, the lid 163 has a dome-like form factor; however, lids having other form factors (e.g., flat or reverse curve lids) are also contemplated. The lower portion 162 is coupled to a processing gas intake port 167 and an exhaust port 170 and comprises a baseplate assembly 172, a lower dome 181, a substrate support ring 175, a pre-heat ring 173, a substrate lift assembly 193, a substrate support assembly 196, one or more upper lamps 189 and one or more lower lamps 190, and a lower pyrometer 192. Although the term "ring" is used to describe certain components of the processing chamber, such as the pre-heat ring 173, it is contemplated that the shape of these components need not be circular and may include any shape, including but not limited to, rectangles, polygons, ovals, and the like.

The substrate support ring 175 provides a support for a substrate during processing and is configured to work in concert with a multi-zonal energy source, such as lamps 183, 184, 189, 190. The substrate support ring 175 may be formed from an optically transparent material, such as quartz.

During processing, the edge of the substrate 106 is supported by the substrate support ring 175. The lamps 183, 184, 189, and 190 are sources of infrared (IR) radiation (i.e., heat energy) and, in operation, are used to generate a pre-determined temperature distribution across the substrate 106. The lid 163, the clamp ring 164, and the lower dome 181 may be formed from quartz or other IR-transparent and process-compatible materials.

The substrate support assembly 196 generally includes a support bracket 182 having a plurality of support pins 197 coupled to the substrate support ring 175. The substrate lift assembly 193 comprises a substrate lift shaft 177 and a plurality of lift pin modules 194 selectively resting on respective pads 178 of the substrate lift shaft 177. In one implementation, a lift pin module 194 comprises an optional upper portion of the lift pin 179 is movably disposed through an opening 195 in the substrate support ring 175. In operation, the substrate lift shaft 177 is moved to engage the lift pins 179. When engaged, the lift pins 179 may raise the substrate 106 above the substrate support ring 175 or lower the substrate 106 onto the substrate support ring 175. Further, a rotation mechanism may be provided to rotate the substrate support ring 175 (and the substrate 106 when disposed thereon).

The support systems 180 include components used to execute and monitor pre-determined processes (e.g., growing epitaxial films) in the processing chamber 160. Such components generally include various sub-systems. (e.g., gas panel(s), gas distribution conduits, vacuum and exhaust sub-systems, and the like) and devices (e.g., power supplies, process control instruments, and the like) of the processing chamber 160. These components are well known to those skilled in the art and are omitted from the drawings for clarity.

The controller 185 may be provided and coupled to the processing chamber 160 for controlling the components of the processing chamber 160. The controller 185 may be any suitable controller for controlling the operation of a substrate processing chamber. The controller 185 generally comprises a Central Processing Unit (CPU) 186, a memory 187, and support circuits 188 and is coupled to and controls the processing chamber 160 and support systems 180, directly (as shown in FIG. 1) or, alternatively, via computers (or controllers) associated with the processing chamber and/or the support systems.

The CPU 186 may be any form of a general purpose computer processor that can be used in an industrial setting. The support circuits 188 are coupled to the CPU 186 and may comprise cache, clock circuits, input/output subsystems, power supplies, and the like. Software routines, such as the methods for processing substrates disclosed herein, for example with respect to FIG. 3 and FIG. 4 below, may be stored in the memory 187 of the controller 185. The software routines, when executed by the CPU 186, transform the CPU 186 into a specific purpose computer (controller) 185. The software routines may also be stored and/or executed by a second controller (not shown) that is located remotely from the controller 185. Alternatively or in combination, in some implementations, for example where the processing chamber 160 is part of a multi-chamber processing system, each processing chamber of the multi-chamber processing system may have its own controller for controlling portions of the inventive methods disclosed herein that may be performed in that particular processing chamber. In such implementations, the individual controllers may be configured similar to the controller 185 and may be coupled to the controller 185 to synchronize operation of the processing chamber 160.

Figure 2:
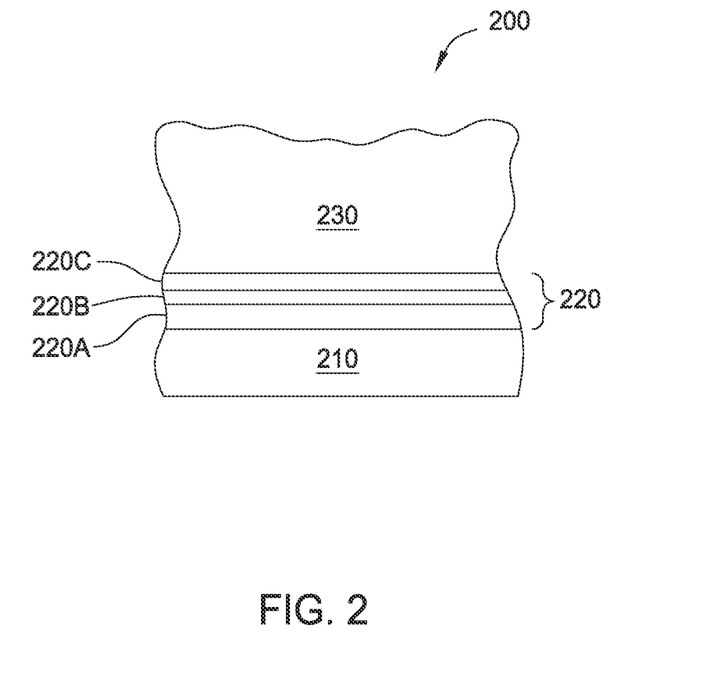
FIG. 2 is a schematic structure of a device formed according to one implementation described herein.
Figure 3:
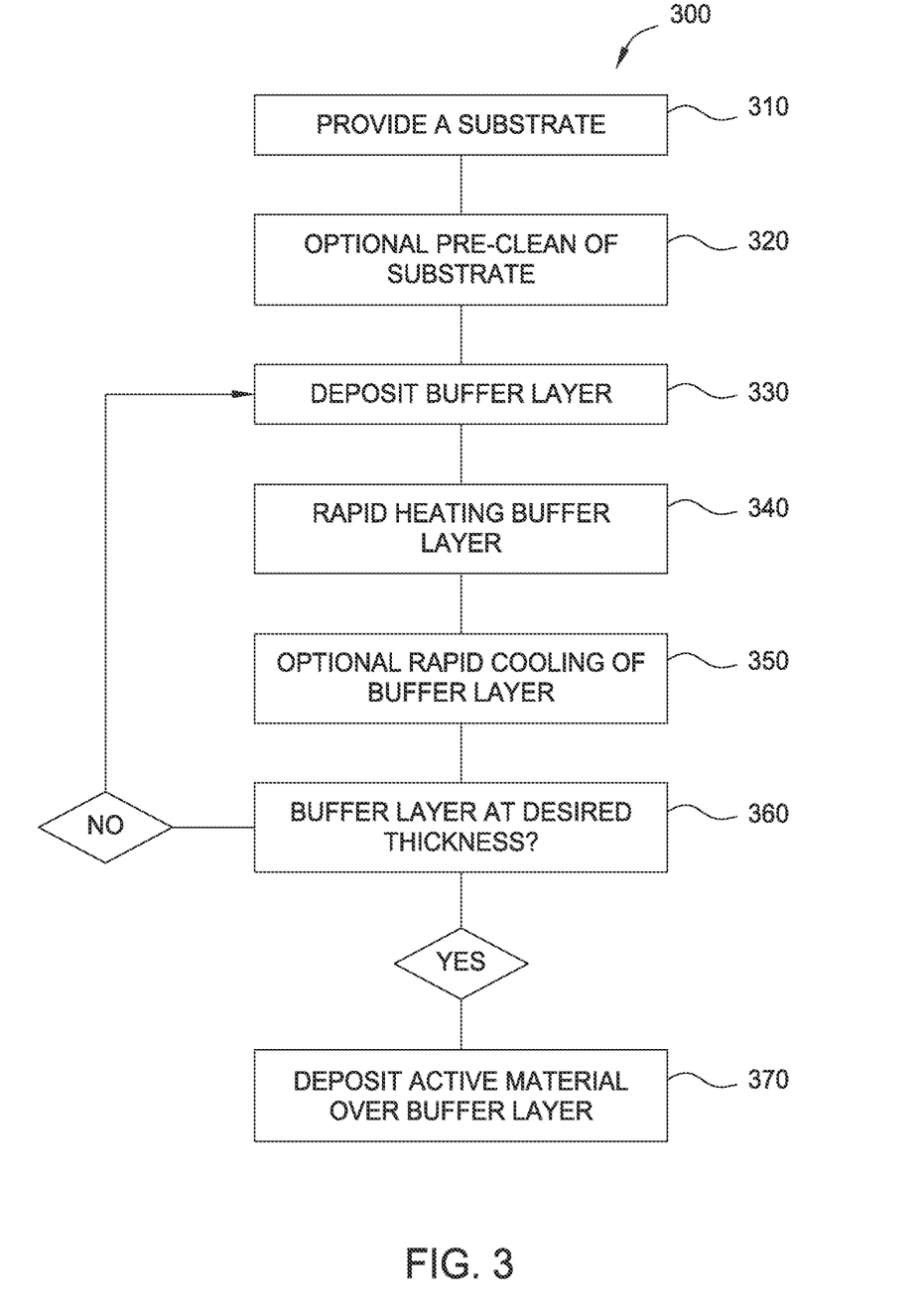
FIG. 3 is a flow diagram depicting a method for forming a structure using heteroepitaxial deposition according to one implementation described herein.

FIG. 2 is a schematic structure of a device 200 formed according to one implementation described herein. FIG. 3 is a flow diagram depicting a method 300 for forming a structure, for example, device 200 of FIG. 2, using heteroepitaxial deposition according to implementations described herein. Method 300 begins by providing a substrate 210 to a reaction chamber at block 310. The substrate may be substrate 210 as depicted in FIG. 2. The substrate may be any substrate that an epitaxial layer can be formed on. These may include, for example, substrate wafers made from sapphire ($Al_2O_3$), silicon (Si) (doped and undoped), silicon carbide (SiC), spinel, zinc oxide, as well as compound semiconductor substrates such as gallium-arsenide (GaAs), lithium gallate, indium phosphide (InP), single-crystal GaN, aluminum nitride (AlN), $GdScO_3$ (GSO), $MoSe_2$, $Ge_2Sb_2Te_5$ (GST) and other chalcogenide materials, among other substrates.

At block 320, the substrate may be pre-cleaned. The pre-clean process may be used to remove native oxides from the surface of the substrate. Prior to formation of the buffer layer, the substrate may be subjected to a pre-clean process and/or a degas process. In some implementations where processing of the substrate is performed ex-situ to the processing cluster tool, the substrate may be subjected to a pre-clean and/or degas process upon entering the cluster tool. For example, if the substrate is a silicon substrate, the Applied Materials SICONI™ Pre-clean processes may be performed on the substrate for removing oxide from the silicon substrate. The SICONI™ Pre-clean process removes native oxide through a low-temperature, two-process dry chemical clean process using $NF_3$ and $NH_3$. The pre-clean process may be performed in a processing chamber positioned on a cluster tool, for example, cluster tool 400 (see FIG. 4) or cluster tool 500 (see FIG. 5). Exemplary pre-clean chambers in which the pre-clean process of block 320 may be performed include SICONI™ pre-clean chamber available from Applied Materials, Inc, of Santa Clara, Calif.

In some implementations, the substrate may be exposed to a fluorine containing precursor and a hydrogen containing precursor in a two part dry chemical clean process. In some implementations, the fluorine containing precursor may comprise nitrogen trifluoride ($NF_3$), hydrogen fluoride (HF), diatomic fluorine ($F_2$), monatomic fluorine (F) and fluorine-substituted hydrocarbons, combinations thereof, or the like. In some implementations, the hydrogen containing precursors may comprise atomic hydrogen (H), diatomic hydrogen ($H_2$), ammonia ($NH_3$), hydrocarbons, incompletely halogen-substituted hydrocarbons, combinations thereof, or the like.

In some implementations, the first part in the two part process may comprise using a remote plasma source to generate an etchant species (e.g., ammonium fluoride ($NHF_4$)) from the fluorine containing precursor (e.g., nitrogen trifluoride ($NF_3$)) and the hydrogen containing precursor (e.g., ammonia ($NH_3$)). By using a remote plasma source, damage to the substrate may be minimized. The etchant species are then introduced into the pre-clean chamber and condensed into a solid by-product on the substrate surface through a reaction with native oxide layer. The second process may then comprise an in-situ anneal to decompose the by-product using convection and radiation heating. The by-product then sublimates and may be removed from the substrate surface via a flow of gas and pumped out of the pre-clean chamber.

At block 330 a buffer layer is deposited on the surface of the substrate. The buffer layer may be buffer layer 220 as depicted in FIG. 2. In some implementations, the buffer layer 220 may be a multi-layer or graded buffer layer as depicted in FIG. 2. Buffer layer 220 may comprise a first buffer layer portion 220A, a second buffer layer portion 220B, and a third buffer layer portion 220C. It should be understood that the depicted buffer layer 220 comprising three layers is only exemplary and that any number of layers may be used to form the buffer layer 220. It should also be understood that in some implementations, the buffer layer 220 comprises a single layer.

The buffer layer 220 may comprise any material that helps accommodate the lattice mismatch between the substrate 210 and the active material layer 230. The buffer layer 220 may be any crystalline film which has a similar lattice structure to the crystalline film that is to be formed thereon. The buffer layer 220 may comprise a Group III-V material or a Group IV material. The buffer layer 220 may be a binary, ternary, or quaternary film. Exemplary buffer layer materials include but are not limited to GaN, AlN, AlGaN, InGaN, InAlGaN, GaAs, $In_xAl_{1-x}As$, $In_xGa_{1-x}As$, InAs, Ge, $Si_{1-x}Ge_x$, SiC, Si:C, Si:CP, SiGe:C, SiGe:B, GeSn, GaSb, GaP, InP, AlSb, AlP, AlSbP, $MoSe_2$ and combinations thereof, and may be undoped or doped with an n-type or p-type dopant element depending upon application, or modified for additional properties, e.g. insulation, where x is a non-zero number. In some implementations, the exemplary buffer materials include materials selected from the group consisting of GaN, AlN, AlGaN, InGaN, InAlGaN, GaAs, InAlAs, Si, Ge, C, Sn, SiGe, SiC, GaSb, AlSb, GaP, AlP, InP, InSb, ZnO, $WSe_2$, $MoSe_2$ and combinations thereof.

The buffer layer 220 may be deposited using any suitable deposition technique. Suitable deposition techniques include epitaxial deposition processes, metal organic chemical vapor deposition (MOCVD) processes, hydride vapor phase epitaxial (HYPE) processes, physical vapor deposition (PVD) processes, chemical vapor deposition (CVD) processes, atomic layer deposition (ALD) processes, Atomic Layer Epitaxy (ALE) and/or any other suitable process.

The as-deposited buffer layer 220 may have one or more layers with a thickness from <2 nanometers to about 5,000 nanometers, depending on the material system and the application. The as-deposited buffer layer 220 may have a thickness from about 50 nanometers to about 500 nanometers.

At block 340, the buffer layer is exposed to a rapid heating process. The rapid heating process may be an annealing process. The conditions of the annealing process are typically selected such that the buffer layer is heated to a temperature below the buffer layer's melting point but high enough to allow diffusion of dopants (when present) and rearrangement of lattice atoms to relax the buffer layer 220. Exemplary annealing processes include soak anneals, spike anneals, nanosecond anneals, millisecond anneals, laser annealing and combinations thereof. In some implementations, the buffer layer 220 is rapidly heated without significantly increasing the temperature of the underlying substrate 210 thus allowing for rapid cooling of the buffer layer. Exemplary thermal processing systems in which the rapid heating process may be performed include the RADIANCE® RTP system, Radianceplus™ RTP system, ASTRA® DSA (dynamic surface anneal) and VULCAN™ RTP system all available from Applied Materials, Inc., Santa Clara, Calif.

The rapid heating process may be performed in the same chamber as the deposition process of block 330. For example, the rapid heating process and the deposition process may be performed in the processing chamber 160 depicted in FIG. 1B. The rapid heating process may be performed in a separate chamber than the deposition process of block 330. In implementations where the rapid heating process is performed in a separate chamber, the separate chamber may be integrated on the same platform as the deposition chamber. In some implementations where the rapid heating process is performed in a separate chamber, the separate chamber may be positioned ex-situ from the integrated platform on which the deposition chamber is positioned.

The annealing process may be any high temperature thermal annealing process that is sufficient to cause the buffer layer to relax. The annealing process may be any high temperature thermal annealing process that is capable of is heating the substrate to a temperature below the substrate's melting point but high enough to allow diffusion of dopants (when present) and rearrangement of lattice atoms. The temperature sufficient to cause the buffer layer to relax may be dependent upon factors including but not limited to the buffer materials and substrate materials used, the relative strain with respect to the substrate material, the type of anneal process used, the duration of the process, the temperature ramp-up rates and the temperature ramp-down rates. In some implementations, the annealing temperature is from about 200 degrees Celsius to about 2,000 degrees Celsius. In some implementations, the annealing temperature is about 900 degrees Celsius or above, for example, about 1,100 degrees Celsius to about 1,300 degrees Celsius.

In some implementations where the material of the buffer layer 220 has a low dissociation temperature, the required annealing temperature should be reached very fast and the duration of anneal should be limited to a relatively short time, such as on the order of about one second or less, or at sub microsecond duration, to preserve the surface morphology and the lattice quality of the buffer layer 220. Therefore, it may be advantageous to use a rapid thermal annealing process or a pulsed laser annealing process to melt and recrystallize the buffer layer 220.

The temperature ramp-up rates may be dependent upon the buffer materials and substrate materials used, the relative strain with respect to the substrate material, the type of anneal process used and the duration of the anneal process. Exemplary ramp-up rates for an RTP processing chamber in which the rapid heating process of block 340 is performed may be ramped at ramp-up rate from about 5 degrees Celsius/second to about 250 degrees Celsius/second, for example, between about 40 degrees Celsius/second and about 150 degrees Celsius/second. Exemplary ramp-up rates for an RTP processing chamber in which the rapid heating process of block 340 is performed may be ramped at >1,000,000° C./s for laser annealing in the millisecond (msec) range, and >1,000,000,000° C./s for nanosecond anneal.

In some implementations the rapid heating process is a laser annealing process. The laser annealing process may be a pulsed laser annealing process. The pulsed laser annealing process as described herein may be performed by delivering electromagnetic radiation energy in a series of sequential pulses of energy to allow for diffusion and rearrangement of lattice atoms. The amount of energy delivered during a single pulse is typically short enough to provide an average diffusion depth that is only a portion of a single lattice plane and thus the annealing process may require multiple pulses to achieve a desired amount of strain relaxation. The buffer layer 220 may be exposed to multiple pulses of energy from a laser that emits radiation at one or more appropriate wavelengths for a desired period of time. The intensity and wavelength may be tuned depending on the amount of movement strain relaxation desired. Wavelengths of energy used may range generally from the microwave, for example about 3 cm, through visible wavelengths, into the deep ultraviolet, for example about 150 nanometers (nm). Wavelengths ranging from about 300 nm to about 1100 nm, for example, may be used in laser applications, such as wavelengths less than about 800 nm.

During the pulsed annealing process, each successive pulse constitutes a micro-anneal cycle in which energy is delivered at and propagated through the target layer (e.g., the buffer layer 220). If desired, the intensity and wavelength may be tuned so that each successive pulse is delivered to the buffer layer 220, which is in the crystalline structure and therefore may serve as seed for recrystallization. Since each pulse is sufficiently short and the additive effects of each pulse is localized and will not cause temperature to rise in the substrate.

In various implementations of the present disclosure, each pulse of the pulsed laser annealing process may deliver an energy density of about 0.2 J/cm.sup.2 to about 100 J/cm.sup.2 at a power level of at least 10 milliWatts (mW), such as between about 10 mW and 10 W, and the number of sequential pulses may vary between about 30 and about 100,000 pulses, each of which has a duration of about 1 nanosecond (nsec) to about 10 milliseconds (msec). The duration of each pulse may be less than 10 msec, such as between about 1 msec and about 10 msec, or between about 1 nsec and about 10 microseconds (μsec), or even less than about 100 nsec. In some examples, duration of each pulse may be between about 1 nsec and about 10 nsec, such as about 1 nsec.

At block 350, the substrate 210 may be exposed to an optional rapid cooling process. The rapid cooling process of block 350 may occur in the same chamber as the rapid heating process of block 340. The rapid cooling process of block 350 may be an active cooling process or a passive cooling process. The rapid cooling process of block 350 may be performed by flowing a coolant through a portion of the chamber in which the cooling process is performed, for example, flowing a coolant through the substrate support on which the substrate is positioned in order to rapidly cool the substrate and/or using a coolant to cool the heating source used during the rapid heating process of block 340. In some implementations where rapid cooling and rapid heating are performed in the same chamber, the chamber may have a chamber liner configured to rapidly dissipate heat.

The temperature ramp-down rates may be dependent upon the buffer materials and substrate materials used, the relative strain with respect to the substrate material, the type of anneal process used and the duration of the anneal process. Exemplary ramp-down rates for epitaxial and RTP systems in which the rapid cooling process of block 350 is performed may be ramped down at a ramp-down rate from between about 3 degrees Celsius/second and about 90 degrees Celsius/second.

In implementations where the buffer layer is heated without significantly heating the substrate on which the buffer layer is formed, the rapid cooling process may occur simply by turning off the heating source.

At block 360 if the buffer layer has achieved a desired thickness, the method 300 proceeds to block 370 where an active material layer may be deposited over the buffer layer. If the buffer layer has not achieved the desired thickness, the method 300 proceeds back to block 330 where additional buffer layer material may be deposited on the previously deposited buffer layer material. The additional buffer layer material may be exposed to the rapid heating process of block 340 and the optional rapid cooling process of block 350.

In certain implementations where the buffer layer is deposited using multiple cycles of deposition, heating and optionally cooling, the defects in each portion are terminated at the surface of each portion prior to deposition of each subsequent layer thus reducing the overall defect density.

While not discussed in detail here, at block 370, one or more device layers and/or active material layers 230 may be formed over the buffer layer 220. The active material layer 230 may include for example, a p-n junction which is necessary for the fabrication of the desired semiconductor device, such as light emitting diodes (LEDs), laser diodes (LDs), or other electronic applications such as transistors. It is contemplated that the process of the present disclosure is suitable for use with more sophisticated structures. Such structures may include those that use one or more quantum wells as active layers, or superlattice structures as part of the crystal transition between the substrate and the device layers, for example.

Figure 4:
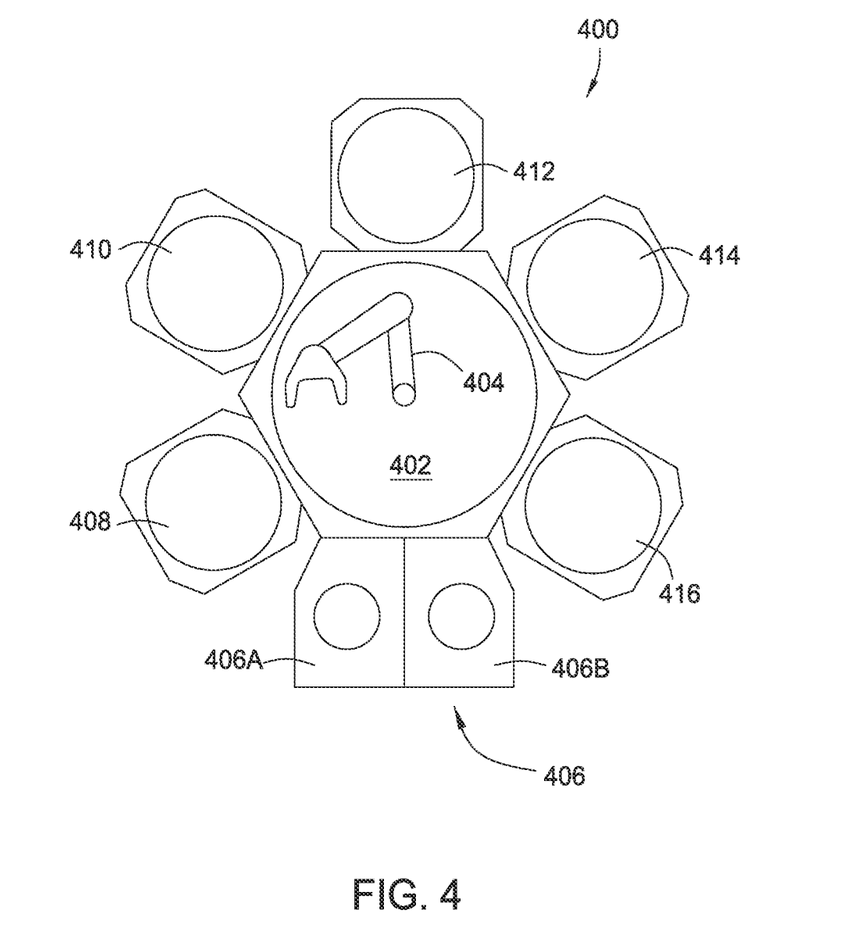
FIG. 4 is a plan view of a cluster tool according to another implementation described herein.

FIG. 4 is a plan view of a cluster tool 400 according to another implementation described herein. The cluster tool 400 features at least one epitaxial deposition chamber, as described above. An example of the cluster tool 400 is the CENTURA® system available from Applied Materials, Inc., of Santa Clara, Calif. Cluster tools manufactured by others may be used as well. A transfer robot 404 of any convenient type is disposed in a transfer chamber 402 of the cluster tool. A load-lock 406, with two load-lock chambers 406A, 406B is coupled to the transfer chamber 402. A plurality of processing chambers 408, 410, 412, 414, and 416 are also coupled to the transfer chamber 402. The plurality of processing chambers 408, 410, 412, 414, and 416 may include at least one of: a pre-clean chamber, a material deposition chamber such as an epitaxial deposition chamber, and a thermal processing chamber, such as an anneal, degas, or oxidation chamber.

Processing chamber 408 may be a pre-clean chamber configured to clean the substrate prior to deposition of a buffer layer and/or device layer. The pre-clean chamber may be configured to perform the Applied Materials SICONI® Pre-clean process. Processing chamber 410 and/or 414 may be a material deposition chamber such as an epitaxial deposition chamber capable of performing an epitaxial growth process. Processing chamber 412 and/or 416 may be a thermal treatment chamber capable of performing a thermal treatment process.

The cluster tool 400 may be used to perform the method 300 described above. During processing, a substrate that is to be processed may arrive to the cluster tool 400 in a pod (not shown). The substrate is transferred from the pod to the vacuum compatible load-lock chambers 406A, 406B by the factory interface robot (not shown). The substrate is then picked by the transfer robot 404 in the transfer chamber 402 which is generally kept in a vacuum state. The transfer robot 404 then loads the substrate into the processing chamber 408 for cleaning as described in block 320. The transfer robot 404 then picks up the substrate from the processing chamber 408 and loads the substrate into the processing chamber 410 or 414, whichever is available, for epitaxial deposition. An epitaxial buffer layer may be grown on the cleaned substrate in the processing chamber 410 or 414. The transfer robot 404 then picks up the substrate from the processing chamber 410 or 414 and transfers the substrate into the thermal processing chamber 412 or 416 whichever is available. The epitaxial buffer layer is then exposed to a rapid heating/cooling process as described in block 340 and block 350. The transfer robot 404 then picks the substrate from the thermal processing chamber 412 or 416 and transfers the substrate to processing chamber 414 for deposition of active material over the buffer layer as described in block 370.

Figure 5:
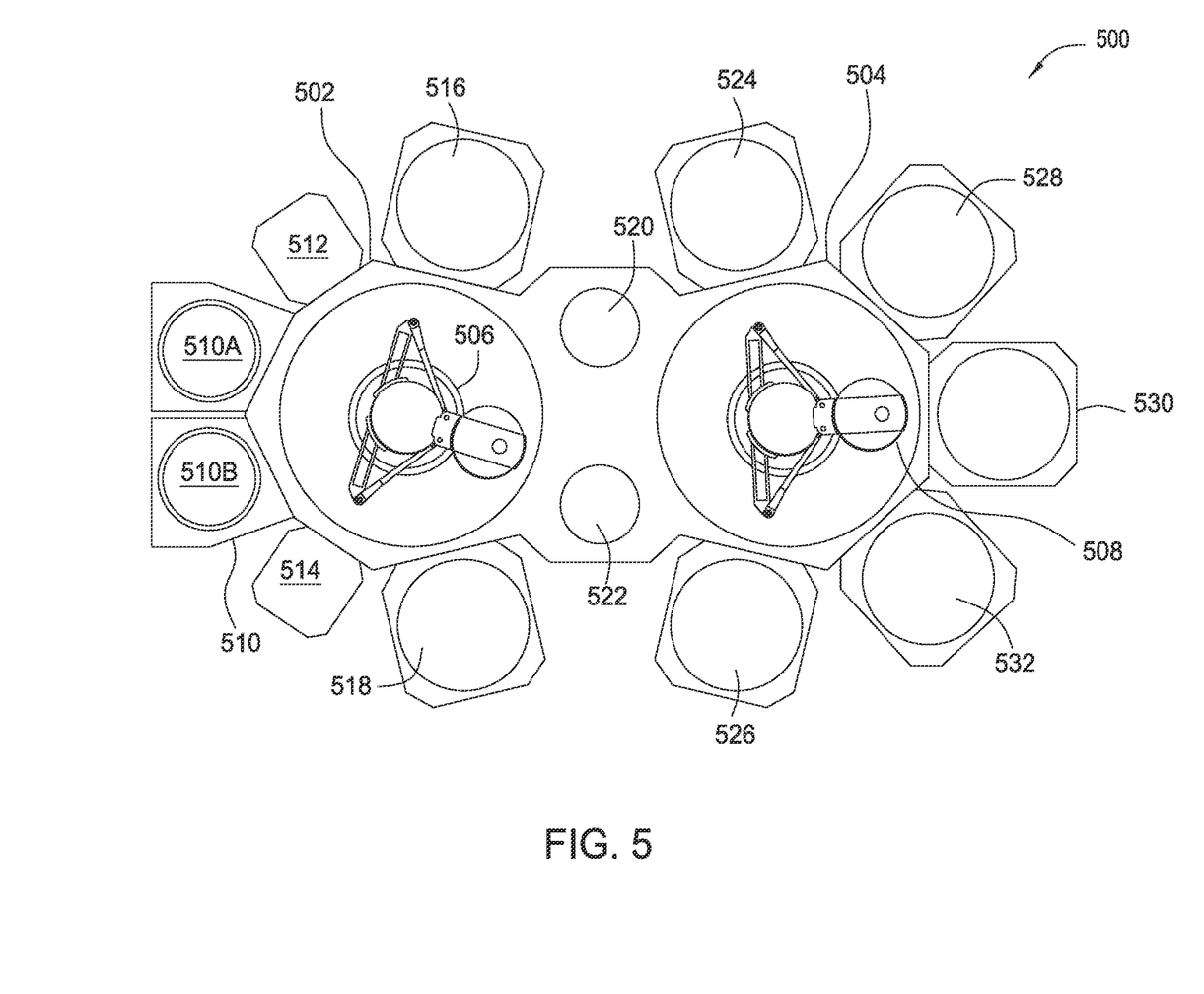
FIG. 5 is a plan view of a cluster tool according to another implementation described herein.

FIG. 5 is a plan view of a cluster tool 500 or integrated processing system according to another implementation described herein. The cluster tool 500 features a plurality of processing chambers coupled to two transfer chambers 502 and 504. An example of the cluster tool 500 is the ENDURA® system of Applied Materials, Inc, Cluster tools manufactured by others may be used as well. Each of the transfer chambers 502 and 504 has a transfer robot 506 and 508, respectively. A load-lock 510, featuring two load-lock chambers, 510A, 510B is coupled to the first transfer chamber 502. Substrates are passed between the transfer chambers using pass through chambers 520 and 522, which are accessible to both transfer robots 506 and 508.

In a typical configuration, any or all of the processing chambers 524, 526, 528, 530, and 532 may be dual-function deposition/thermal processing chambers, with deposition by epitaxial processes, which may be plasma enhanced, according to the configuration of the lid portions thereof. In one implementation, processing chambers 524 and 526 are epitaxial deposition chambers for forming a buffer layer and/or device layer, and at least one of processing chambers 528, 530, and 532 are thermal processing chambers for annealing the as-deposited layers. Chambers 516 and 518 may be pre-clean chambers, and chambers 512 and 514 may be degas, cooling, or surface passivation chambers. Any of the chambers 516, 518, 524, 526, 528, and 532 may be combined plasma clean and reoxidation chambers.

Certain implementations described herein accelerate the development of long misfit rate dislocations leading to faster relaxation of the buffer layer without having to grow a thick buffer layer. Furthermore, certain implementations described herein use just enough energy to relax the buffer layer using existing dislocations to generate strain without developing additional defects.

While the foregoing is directed to implementations of the present disclosure, other and further implementations of the disclosure may be devised without departing from the basic scope thereof, and the scope thereof is determined by the claims that follow.

The invention claimed is:

1. A method of heteroepitaxial deposition of a strain relaxed buffer (SRB) layer on a substrate, comprising:
    epitaxially depositing a buffer layer over a dissimilar substrate;
    rapidly heating the buffer layer by exposing the buffer layer to a pulsed laser annealing process to relax the buffer layer;
    rapidly cooling the buffer layer; and
    determining whether the buffer layer has achieved a desired thickness, wherein the buffer layer is a material selected from the group consisting of: GaN, AlN, AlGaN, InGaN, InAlGaN, GaAs, InAlAs, Si, Ge, C, Sn, SiGe, SiC, GaSb, AlSb, GaP, AlP, InP, InSb, ZnO, $WSe_2$, $MoSe_2$ and combinations thereof.

2. The method of claim 1, further comprising repeating the epitaxially depositing, the rapidly heating and the rapidly cooling until the buffer layer achieves the desired thickness.

3. The method of claim 1, further comprising depositing active material over the buffer layer.

4. The method of claim 1, wherein the buffer layer is a material selected from the group consisting of: GaN, AlN, AlGaN, InGaN, InAlGaN, InAlAs, GaSb, AlSb, GaP, AlP, InP, InSb, ZnO, $WSe_2$, $MoSe_2$ and combinations thereof.

5. The method of claim 4, wherein the substrate is a material selected from the group consisting of: sapphire ($Al_2O_3$), silicon (Si) (doped and undoped), silicon carbide (SiC), spinel, zinc oxide, gallium-arsenide (GaAs), lithium gallate, indium phosphide (InP), single-crystal GaN, aluminum nitride (AlN), $GdScO_3$ (GSO), $MoSe_2$, $Ge_2Sb_2Te_5$ (GST), and combinations thereof.

6. The method of claim 1, wherein the epitaxially depositing a buffer layer and rapidly heating the buffer layer occur in separate processing chambers.

7. The method of claim 1, wherein the pulsed laser annealing process comprises exposing the buffer layer to multiple pulses of energy at wavelengths less than about 800 nanometers.

8. The method of claim 7, wherein each pulse of the pulsed laser annealing process delivers an energy density of about 0.2 Joules/$cm^2$ to about 100 Joules/$cm^2$ at a power level between about 10 milliwatts and about 10 watts.

9. The method of claim 1, wherein the rapidly cooling the buffer layer comprises flowing a coolant through a substrate support on which the substrate is positioned.

10. A method of forming a heteroepitaxial film on a substrate in an integrated processing system, comprising:
    epitaxially depositing a buffer layer over a dissimilar substrate in a first processing chamber of an integrated processing system;
    removing the substrate from the first processing chamber without exposing the substrate to atmosphere;
    transferring the substrate to a second processing chamber of the integrated processing system; and
    annealing the buffer layer in the second processing chamber, comprising:
        rapidly heating the buffer layer by exposing the buffer layer to a pulsed laser annealing process to relax the buffer layer; and
        rapidly cooling the buffer layer.

11. The method of claim 10, further comprising:
    transferring the substrate back to the first processing chamber;
    epitaxially depositing an additional portion of the buffer layer over the buffer layer;
    removing the substrate from the first processing chamber without exposing the substrate to atmosphere;
    transferring the substrate to the second processing chamber of the integrated processing system; and
    annealing the additional portion of the buffer layer in the second processing chamber, wherein annealing the additional portion of the buffer layer comprises:
        rapidly heating the additional portion of the buffer layer by exposing the additional portion of the buffer layer to a pulsed laser annealing process to relax the additional portion of the buffer layer; and
        rapidly cooling the additional portion of the buffer layer.

12. The method of claim 10, further comprising:
    removing the substrate from the second processing chamber without exposing the substrate to atmosphere;
    transferring the substrate to a third processing chamber of the integrated processing system; and
    depositing an active material layer over the buffer layer.

13. The method of claim 10, wherein the second processing chamber is a millisecond annealing chamber or a nanosecond annealing chamber.

14. The method of claim 10, wherein the pulsed laser annealing process comprises exposing the buffer layer to multiple pulses of energy at wavelengths less than about 800 nanometers.

15. A method of forming a heteroepitaxial film on a substrate in an integrated processing system, comprising:
    epitaxially depositing a buffer layer over a dissimilar substrate in a first processing chamber of an integrated processing system;
    removing the substrate from the integrated processing system;
    transferring the substrate to a second processing chamber positioned ex-situ to the integrated processing system; and
    annealing the buffer layer in the second processing chamber, wherein annealing the buffer layer comprises:
        rapidly heating the buffer layer by exposing the buffer layer to a pulsed laser annealing process to relax the buffer layer; and
        rapidly cooling the buffer layer.

16. The method of claim 15, further comprising:
    transferring the substrate into a pre-clean chamber positioned in the integrated processing system;
    cleaning the buffer layer;
    transferring the substrate from the pre-clean chamber to the first processing chamber without exposing the substrate to atmosphere; and
    epitaxially depositing an additional portion of the buffer layer over the buffer layer in the first processing chamber.

17. The method of claim 16, further comprising:
removing the substrate from the first processing;
transferring the substrate to the second processing chamber; and
annealing the additional portion of the buffer layer in the second processing chamber.

18. The method of claim 15, further comprising:
removing the substrate from the second processing chamber;
transferring the substrate to a third processing chamber of the integrated processing system; and
depositing an active material layer over the buffer layer.

19. The method of claim 15, wherein the second processing chamber is a millisecond annealing chamber or a nanosecond annealing chamber.

20. The method of claim 15, wherein the pulsed laser annealing process comprises exposing the buffer layer to multiple pulses of energy at wavelengths less than about 800 nanometers.

* * * * *

UNITED STATES PATENT AND TRADEMARK OFFICE
CERTIFICATE OF CORRECTION

PATENT NO. : 9,443,728 B2
APPLICATION NO. : 14/461191
DATED : September 13, 2016
INVENTOR(S) : Swaminathan T. Srinivasan et al.

It is certified that error appears in the above-identified patent and that said Letters Patent is hereby corrected as shown below:

In the Specification

In Column 1, Line 23, delete "IHV" and insert -- II-IV --, therefor.

In Column 1, Line 27, delete "(FETs." and insert -- (FETs). --, therefor.

In Column 11, Line 7, delete "(HYPE)" and insert -- (HVPE) --, therefor.

In Column 11, Line 32, delete "Radianceplus™" and insert -- RadiancePlus™ --, therefor.

Signed and Sealed this
Twenty-seventh Day of December, 2016

Michelle K. Lee
*Director of the United States Patent and Trademark Office*